United States Patent
Barsumian et al.

(10) Patent No.: US 7,212,008 B1
(45) Date of Patent: May 1, 2007

(54) SURVEILLANCE DEVICE DETECTION UTILIZING NON LINEAR JUNCTION DETECTION AND REFLECTOMETRY

(76) Inventors: Bruce R. Barsumian, 459 Hampton Cir., Cookeville, TN (US) 38501; Thomas H. Jones, 800 Dry Valley Rd., Cookeville, TN (US) 38506; Charles A. Liter, 145 Hawkins Crawford Rd., Cookeville, TN (US) 38501

( * ) Notice: Subject to any disclaimer, the term of this patent is extended or adjusted under 35 U.S.C. 154(b) by 0 days.

(21) Appl. No.: 11/266,538

(22) Filed: Nov. 3, 2005

(51) Int. Cl.
  *G01R 31/11* (2006.01)
(52) U.S. Cl. ............... 324/533; 324/534; 324/535
(58) Field of Classification Search ............ 324/533, 324/534, 535; 379/7, 35, 22.01
See application file for complete search history.

(56) References Cited

U.S. PATENT DOCUMENTS

| | | |
|---|---|---|
| 3,631,484 A | 12/1971 | Augenblick |
| 4,053,891 A | 10/1977 | Optiz |
| 4,063,229 A | 12/1977 | Welsh et al. |
| 4,123,749 A | 10/1978 | Hartmann et al. |
| 4,331,957 A | 5/1982 | Enander et al. |
| 4,413,254 A | 11/1983 | Pinneo et al. |
| 4,439,769 A | 3/1984 | Masak |
| 4,471,344 A | 9/1984 | Williams |
| 4,547,724 A | 10/1985 | Beazley et al. ............... 324/57 |
| 4,586,048 A | 4/1986 | Downie |
| 4,595,915 A | 6/1986 | Close |
| 4,700,179 A | 10/1987 | Fancher |
| 5,068,614 A | 11/1991 | Fields et al. ............... 324/534 |
| 5,191,343 A | 3/1993 | Danzer et al. |
| 5,414,410 A | 5/1995 | Davies et al. |
| 5,881,132 A * | 3/1999 | O'Brien et al. ............ 379/35 |
| 5,990,791 A | 11/1999 | Endreasen et al. |
| 5,994,905 A * | 11/1999 | Franchville ............... 324/533 |
| 6,057,765 A | 5/2000 | Jones et al. ............... 340/572.2 |
| 6,097,798 A * | 8/2000 | Albers et al. ............ 379/114.28 |
| 6,163,259 A | 12/2000 | Barsumian et al. |
| 6,177,801 B1 * | 1/2001 | Chong ........................ 324/520 |
| 6,466,649 B1 | 10/2002 | Walance et al. .......... 379/22.03 |
| 6,744,854 B2 | 6/2004 | Berrier et al. ............ 379/22.03 |
| 6,759,853 B2 | 7/2004 | Butler ........................ 324/534 |
| 6,765,527 B2 | 7/2004 | Jablonski et al. |
| 6,816,575 B2 | 11/2004 | Lowell et al. ............. 379/1.04 |
| 6,897,777 B2 | 5/2005 | Holmes et al. ........... 340/572.2 |
| 6,934,655 B2 * | 8/2005 | Jones et al. ................ 702/108 |
| 6,937,944 B2 | 8/2005 | Furse et al. .................. 702/58 |
| 2004/0036478 A1 * | 2/2004 | Logvinov et al. .......... 324/534 |

* cited by examiner

*Primary Examiner*—Andrew Hirshfeld
*Assistant Examiner*—Thomas Valone

(57) ABSTRACT

An apparatus for detecting concealed surveillance devices coupled to a transmission line uses either a time domain or frequency domain reflectometry operation to locate any impedance anomalies on the transmission line and a non-linear junction detection operation to classify the located impedance anomalies as semiconductor or non-semiconductor based anomalies. The reflectometry operation utilizes the reflection of a test signal to determine the distance to any reflecting impedance anomalies on the transmission line that may be indicative of an electronic device being coupled to the transmission line. The non-linear junction detection operation then compares the amplitudes of re-radiated second and third harmonics of a transmitted fundamental frequency signal to determine if the reflecting impedance anomalies are the result of a semiconductor based non-linear junction. A DC bias voltage and a balanced load may be added to the transmission line to enhance the line's response to the test signals. Any unidentified semiconductor based anomalies are manually inspected to determine if they represent convert surveillance devices.

19 Claims, 6 Drawing Sheets

SURVEILLANCE DEVICE DETECTION UTILIZING NON LINEAR JUNCTION DETECTION AND REFLECTOMETRY

FIELD OF THE INVENTION

The present invention relates generally to the detection of surreptitious surveillance devices. More particularly, the present invention relates to the use of either time or frequency domain reflectometry and non-linear junction detection to determine the presence, location and nature of a surreptitious surveillance device attached to a communication line.

CROSS-REFERENCES TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

BACKGROUND OF THE INVENTION

Counter surveillance professionals are obviously interested in locating concealed surveillance devices. Often these concealed surveillance devices are coupled to communication or power transmission lines so that they can monitor any transmissions on the line or use the lines to complete their own covert transmissions. The coupling of the surveillance device to the transmission lines usually creates an impedance anomaly on the line that affects the transmission of signals along the line under certain circumstances. Therefore, counter surveillance professionals need a way to locate impedance anomalies on transmission lines caused by surveillance devices coupled to the lines such that the surveillance devices can be removed.

Telecommunications and wiring inspection applications in the airline and automobile industries require examining wires and structures for the presence of harmful corrosive junctions and/or proper wire interconnections. Prior art methods for inspecting such systems are not able to both detect and classify impedance anomalies as either corrosive junctions or semiconductor device based connections. Therefore, an improved way of inspecting wired networks is needed.

Time domain reflectometry (TDR) has been used by telecommunications providers as a testing device to locate impedance anomalies on their existing telephone transmission lines. These transmission lines typically contain one or more impedance anomalies due to connections to the lines by devices such as load coils and bridged taps. However, impedance anomalies may occur due to installation errors, faulty lines, or surreptitious connections. These anomalies result in a loss of transmission efficiency and performance because a portion of the energy propagating along the transmission line is reflected back in the direction of the transmitting source. These reflections can cause a significant reduction in signal amplitude when the reflected signal is combined with the original signal, thereby, disrupting any normal transmissions on the line. Time domain reflectometry is typically used to locate and quantify the significance of these anomalies.

Time domain reflectometry involves transmitting a test signal down the transmission line and measuring a time delay between the transmitting of the test signal and the reception of a reflection. If the velocity of propagation for the line is known, the distance to the reflecting impedance anomaly can be determined. Time domain reflectometry can provide some information about the type of impedance anomaly such as is the impedance anomaly more inductive or capacitive. It can also provide accurate range information to the anomaly. Unfortunately, time domain reflectometry cannot provide information about whether or not the anomaly is due to an electronic surveillance device or a mechanical connection or installation imperfection. Thus, since transmission lines typically have several impedance anomalies, a counter surveillance professional interested in locating concealed surveillance devices will be required to manually inspect each identified impedance anomaly to determine if the anomaly is the result of a concealed surveillance device.

Frequency domain reflectometry (FDR) can provide impedance information similar to time domain reflectometry, however frequency domain reflectometry uses a frequency swept waveform to detect any impedance anomalies on a transmission line. As the frequency of the waveform is swept through a range of frequencies, the transmission line's response to the swept waveform is monitored. The amplitude of the measured signal response will exhibit a variation with frequency that is a composite of the fluctuations in impedance due to any reflection points along the line under test. By examining these variations in the line's response to the swept frequency waveform, the location of the impedance anomalies can be determined. Like a time domain reflectometry process, an frequency domain reflectometry process can also provide information regarding the range and nature of the impedance anomaly, but it cannot predict whether or not the anomaly was caused by an electronic device or by some other type of discontinuity.

Therefore, in view of the above discussed deficiencies in the prior art, what is needed is an improved ability to detect impedance anomalies on a transmission line that correspond to electronic devices coupled to the transmission line.

BRIEF SUMMARY OF THE INVENTION

An embodiment of the present invention is directed toward a method of detecting the presence of dissimilar metal/corrosive junctions and surveillance devices coupled to a transmission line. In accordance with the method, a reflectometry operation is performed on the transmission line to locate any impedance anomalies on the transmission line. The reflectometry operation may be based on time domain reflectometry technology or frequency domain reflectometry technology. However, frequency domain reflectometry is the preferred method due to the fact that it is potentially less damaging to the normal operating circuitry associated with the transmission line. This is because a time domain reflectometry process uses a high power narrow pulse that could potentially cause damage to some circuitry. Conversely, a frequency domain reflectometry process uses a lower power frequency swept waveform and relies on digital signal processing integration for improved sensitivity. Using either reflectometry process, a distance to any impedance anomalies located on the transmission line is determined. In addition, the reflectometry processes may be used to determine additional information regarding the capacitive, inductive, and resistive nature of the impedance anomaly based on the shape of the graph produced by the reflectometry process. A non-linear junction device detection operation is also performed on the transmission line to classify any located impedance anomalies as either semiconductor or corrosive/dissimilar metal junction based. The non-linear junction detection operation includes coupling a fundamental frequency signal to the transmission line and monitoring the transmission line's response to the fundamental frequency signal to determine if any signals are present on the transmission line at harmonic frequencies of the fundamental signal. A signal strength at a second harmonic frequency of the fundamental signal is compared to a signal strength at a third harmonic frequency of the fundamental signal to determine if a semiconductor based impedance anomaly is reradiating the harmonic signals. The reflectometry operation is preferably performed on the transmission line when the transmission line is connected to its normal operating circuit. However, if the reflectometry operation is performed on a dry line, i.e. a line that is not connected to it's normal electronic operating circuitry, a balanced impedance load matched to the characteristic impedance of the transmission line may be added to the end of the line under test so that the relatively large reflections from the open circuit end of the line will not mask the relatively small reflections resulting from impedance anomalies. The non-linear junction device detection operation is preferably performed on the transmission line when the transmission line is disconnected from its normal operating circuit.

In an alternative embodiment of the method, the non-linear junction detection process is performed prior to the frequency domain reflectometry process with the transmission line disconnected from any electronic circuitry. In accordance with this method, if there is no semi-conductor non-linear junction detected, there is no need to perform the reflectometry process to locate the impedance anomalies.

In yet another alternative embodiment, the non-linear junction detection process is accomplished using a signal that is also utilized by the reflectometry process. One example of such a signal that could be utilized is a short duration, linear frequency modulated signal, commonly referred to as a chirp waveform, such that the frequency sweep of the chirp provides reflectometry information while the second and third harmonic reflection response from a surreptitious electronic device to the chirp waveform is utilized for the non-linear junction detection operation. In accordance with this method, a single graphic display is produced that displays the results of both the non-linear junction device detection operation and the reflectometry operation such that impedance anomalies associated with electronic devices are identified by the graph.

In accordance with any of the previously discussed methods and embodiments, a DC voltage bias may be introduced to a dry line, i.e. a line not intentionally connected to any electronic circuitry, to enhance the response to the reflectometry and non-linear junction detection processes. Applying a DC voltage bias to the dry line has the effect of biasing or powering any potential surreptitious electronic connections which enhances the detection process. Furthermore, multiple measurements at different DC bias voltages or different DC voltage polarities may result in differing responses to either the reflectometry or non-linear junction detection processes that provide additional indications of any surreptitious electronics connected to the line. These measurements may be made at different discrete DC bias voltage levels or a time varying DC voltage may be applied and measurements observed as a function of the applied DC voltage change. If there are no surreptitious electronics connected to the line, the measurements should be constant for variations in applied DC voltage. However, if any surreptitious electronics are connected to the line, the measurements should vary as a function of the varying DC bias voltage due to the varying response of the surreptitious electronics to the applied DC bias voltage. Conceptually, the benefit of this process may also be realized by applying an AC voltage signal.

Another embodiment of the present invention is directed toward an apparatus for detecting the presence of an electronic device coupled to a line under test. The apparatus includes a signal generator for generating a reflectometry test signal and a non-linear junction detection signal and coupling the signals to the line under test. The signal generator may also generate a DC voltage bias that can be used to enhance the response to the reflectometry and non-linear junction detection processes. The reflectometry test signal is preferably a frequency domain reflectometry test signal. However, in an alternative embodiment, a single signal may be used as the reflectometry signal and the nonlinear junction detection signal. A analog-to-digital converter receives response signals from the line under test and converts the response signals into digital data. The apparatus contains digital processing circuitry such as but not limited to a microcontroller, microprocessor, Field Programmable Gate Array (FPGA), digital controller, logic circuit, etc. The digital processing circuitry selectively controls the signal generator's functioning to generate the reflectometry test signal and the non-linear junction detection signal and processes the digital data received in response to the generated signals to locate any impedance anomalies on the line under test and determine if any semiconductor based non-linear junctions are coupled to the line under test. The digital processing circuitry has processing logic for comparing an amplitude of a reradiated second harmonic and an amplitude of a reradiated third harmonic of the non-linear junction detection signal to determine if the non-linear junction is semiconductor based. The digital processing circuitry also controls the DC bias circuitry in the signal generator to perform measurements of the reflectometry process and the non-linear junction detection process at different DC bias voltages, and processing logic to evaluate the measurement results at the different bias voltage levels. The digital processing circuitry also determines a distance to the located impedance anomalies based upon the reflectometry results. An output communicates the results to an operator of the apparatus. The output preferably includes a graphic display that identifies impedance anomalies associated with semiconductor based non-linear junctions.

Yet another embodiment of the present invention is directed toward a device for determining whether an electronic device is coupled to a line under test and locating any such electronic device identified. The device includes a signal generator for selectively generating signals and coupling the signals to the line under test. An analog-to-digital converter converts response signals received from the line under test into digital data. A digital processor selectively controls the analog-to-digital converter and the signal generator. The digital processor includes reflectometry processing logic for implementing a reflectometry operation to locate any impedance anomalies on the line under test and non-linear junction detection processing logic for performing a non-linear junction detection operation to determine if any non-linear junctions are coupled to the line under test.

If the reflectometry operation is based on frequency domain reflectometry, the processing logic includes logic for performing an inverse Fourier Transform in order to generate a graph of impedance anomalies as a function of range. The non-linear junction detection operation is preferably performed with the line under test disconnected from its normal operating circuit. If the testing is to be performed on a line that is not connected to it's intended circuitry, the non-linear junction detection process is preferably performed first as simple test to determine if the line is connected to any type of electronic circuitry. If the test is positive, then the reflectometry process may be utilized to locate and determine the nature of the impedance anomaly that contains the non-linear junction. Alternatively, the device may be designed to perform the reflectometry and non-linear junction detection functions in a single operation using a single time varying waveform. A preferred embodiment of the device contains an additional balanced load that can be attached to the end of a dry line to enhance the accuracy of the reflectometry process so that large reflections from an open circuit transmission line do not mask or overshadow potential low level impedance anomalies. A preferred embodiment of the device contains a DC bias voltage generator that applies a DC bias voltage to a dry line to enhance the responses to both the reflectometry and non-linear junction detection functions. This DC voltage generator may generate time varying waveforms to produce varying responses from the reflectometry or non-linear detection functions. A preferred embodiment includes a graphic display that displays results of the reflectometry operation and the non-linear junction device detection operation to a user of the device. Most preferably, the graphic display indicates the difference between impedance anomalies associated with semiconductor based non-linear junctions and corrosive or dissimilar metal based non-linear junctions.

DETAILED DESCRIPTION OF THE INVENTION

Embodiments of the present invention are directed toward a method and apparatus for detecting the presence of concealed surveillance devices coupled to a transmission line using a combination of either time or frequency domain reflectometry analysis and non-linear junction detection processes. The combination of these processes reduces the time and effort required to inspect a transmission line for covert surveillance devices while improving the likelihood of locating any such devices.

In accordance with a preferred embodiment of the present invention, the first step in detecting a covert surveillance device coupled to a transmission line is to perform a time domain or frequency domain reflectometry operation to determine the presence and location of any reflecting discontinuities or impedance anomalies on the transmission line under test. Once the anomalies and discontinuities have been located, a non-linear junction detection operation is performed on the line to determine if any of the anomalies or discontinuities are the result of semiconductor based electronic devices. If such semiconductor based devices are detected on the line, a manual inspection of the located anomalies and discontinuities is performed to determine if one of the anomalies represents a covert surveillance device coupled to the line. If the line is not connected to any known electronic devices, the non-linear junction detection process may be performed prior to the frequency domain reflectometry process such that, if there are no semi-conductor non-linear junctions detected, there is no need to perform the reflectometry process.

Figure 1:
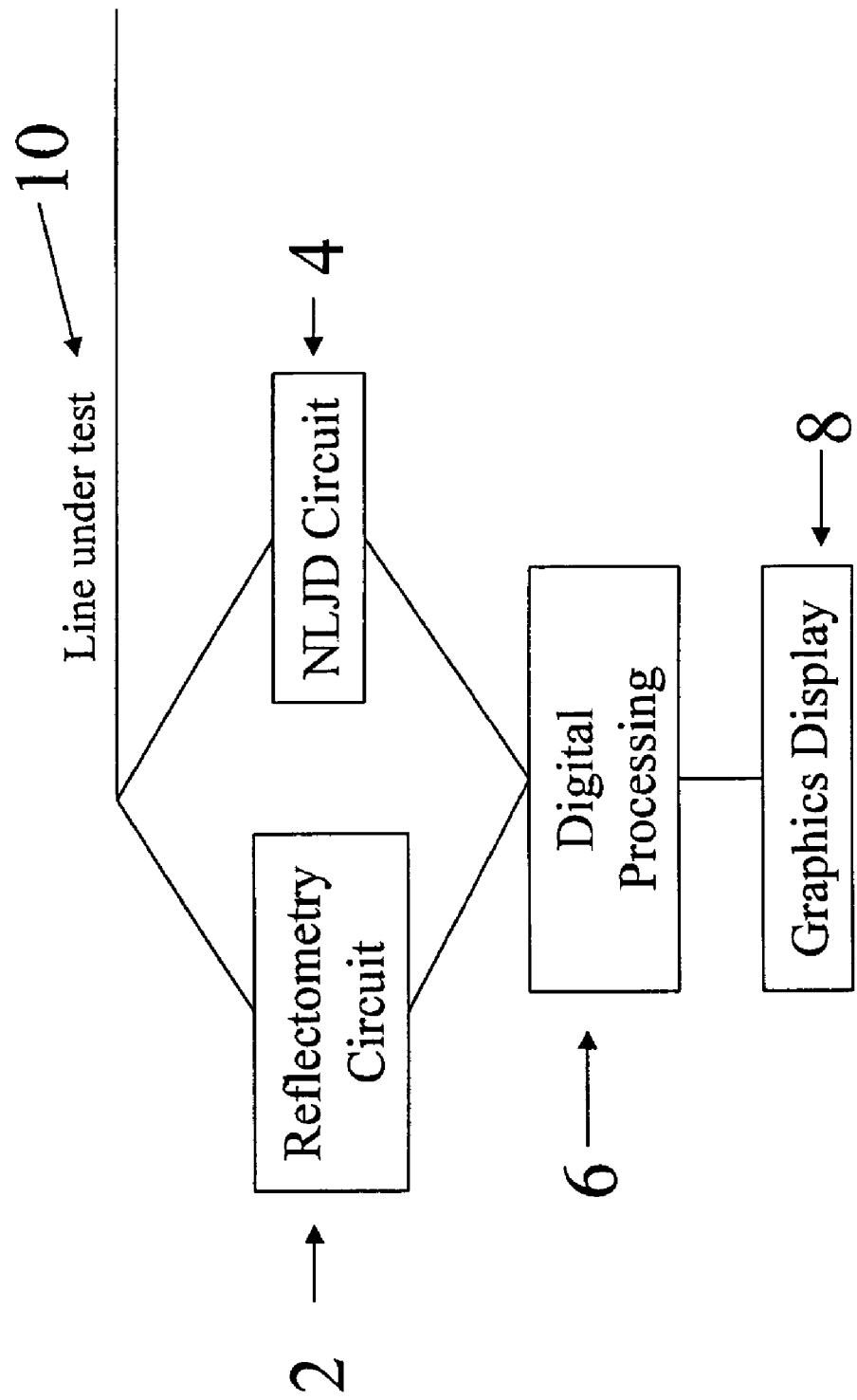
FIG. 1 is a functional block diagram of the basic components of a system for detecting and locating a covert surveillance device attached to a conductive wire in accordance with an embodiment of the present invention.

Referring now to FIG. 1, a functional block diagram of a basic system for detecting and locating a covert surveillance device attached to a conductive wire in accordance with an embodiment of the present invention is shown. As will be appreciated by those skilled in the art, additional low level components that are well known in the prior art will be needed to implement the system of FIG. 1. The basic components of the present invention are time or frequency domain reflectometry circuitry 2, non-linear junction detection circuitry 4, digital processing circuitry 6 and a graphics display 8 coupled to a line under test 10. The reflectometry circuit 2 examines the line under test 10 to locate any impedance anomalies. If any impedance anomalies are located, the line under test 10 is decoupled from its associated network and the non-linear junction detection circuitry 4 is used to classify the impedance anomaly or discontinuity as either semi-conductor based or non-semi-conductor based. The digital processing circuitry 6 and the graphics display 8 are used to analyze and display the results of the reflectometry 2 and non-linear junction detection 4 processes.

Figure 2:
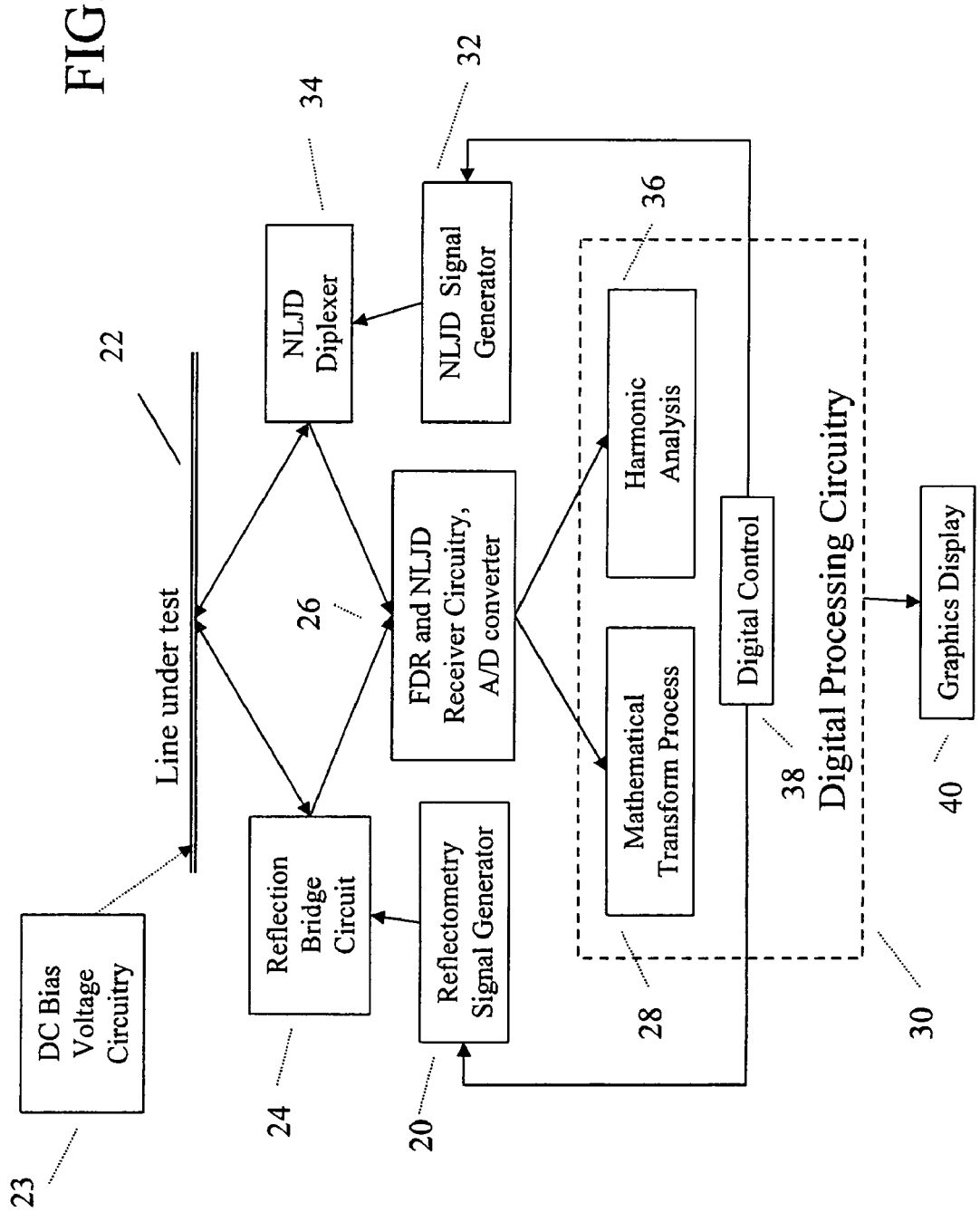
FIG. 2 is a functional block diagram of the basic reflectometry and non-linear junction detection components of a system for detecting and locating a covert surveillance device attached to a conductive wire in accordance with an embodiment of the present invention.

Referring now to FIG. 2, a more detailed and expanded diagram of the system of FIG. 1 showing the basic reflectometry and non-linear junction detection components is shown. In accordance with the embodiment of FIG. 2, a reflectometry signal generator 20 is used to generate a reflectometry test signal that is coupled to the line under test 22 through a reflection bridge circuit 24. The reflectometry signal generator 20 is preferably coupled to the line under test 22 with a length of cable such that even reflecting impedance anomalies that occur very near the point of coupling can be detected. The digital control 38 of the signal generator 20 is managed by the microcontroller 30. The nature of the particular test signal generated by the reflectometry signal generator 20 is described in more detail below.

The line under test's 22 responses to the transmitted waveform is monitored to detect the presence of any concealed surveillance devices coupled to the line under test. To perform a frequency domain reflectometry analysis, the line under test's response to the transmitted signal is received by reflection bridge circuit 24 coupled to the line under test 22. The reflection bridge circuit 24 is coupled to the frequency domain reflectometry receiver circuitry 26, which includes an analog-to-digital converter that converts the received response to digital data that can be more readily processed. A Fourier Transform 28 is performed on the digital data with the digital processing circuitry 30. The digital processing circuitry 30 uses the line's response to a transmitted signal and reflectometry based analysis principles to locate any impedance anomalies on the line under test 22 as discussed in more detail herein. The results of the analysis are displayed to a user of the device or system by a graphics display 40.

Once an impedance anomaly has been located using the reflectometry analysis, a non-linear junction detection signal is produced by the NLJD signal generator 32 and coupled to the line under test 22 with the NLJD diplexer 34. The signal generator 32 switches between two fundamental transmit frequencies in order for the frequency of the second and third harmonics to equal the same receive frequency such that both harmonics can be received by the same receiver 26. The digital processing circuitry 30 commands the digital control 38 for the NLJD signal generator 32. The diplexer 34 blocks the receiver 26 from detecting any harmonics produced from the generator 32 and only allows harmonics re-radiated from impedance anomalies to reach the receiver 26. The line under test 22 is preferably uncoupled from its associated network prior to the transmission of the non-linear junction detection signal to simplify the analysis. The outputs of the NLJD diplexer 34 are sent to the receiver circuitry 26 that preferably includes analog-to-digital converters. The outputs of the receiver circuitry 26 are then subjected to a harmonic analysis 36 by the digital processing circuitry 30. The results of the NLJD operation are then displayed on the graphics display 40 as a comparison between the harmonic levels.

The non-linear junction detection process is preferably performed prior to the reflectometry process if no known semiconductor based electronic devices are coupled to the line under test 22. In such a case, if the non-linear junction detection process fails to detect a semiconductor based electronic device, there is no need to perform the reflectometry operation since there are no suspicious impedance anomalies to investigate. However, if there are known semiconductor based electronic devices coupled to the line under test 22, the individual impedance anomalies must be located before they can be classified as either semiconductor or corrosive dissimilar metal based.

DC bias voltage circuitry 23 is provided to enhance the detection capabilities of the reflectometry and non-linear junction based detection processes when no known sensitive electronic components are coupled to the line under test 22 by coupling a DC bias voltage to the line. Such a bias voltage should not be used when sensitive components are coupled to the line under test since the voltage may damage the components. Applying a DC bias voltage increases a semiconductor based non-linear junction's response to a test signal. In addition, the response of the semiconductor based non-linear junction varies depending upon the characteristics of the DC bias voltage to which the junction is exposed. Thus, by coupling a variety of different DC bias voltages to the line under test, semiconductor based non-linear junctions can be identified by their changing responses to the test signal. The DC bias voltage may be varied in amplitude or polarity to identify changes in the junction's response.

A balanced load may also be attached to the end of a dry line to enhance the accuracy of the reflectometry process. An open circuit transmission line produces relatively large reflections in response to a test signal. These reflections may mask or overshadow the relatively smaller reflections caused by any impedance anomalies on the transmission line. The addition of a balanced load to the transmission line prevents any large reflections from an open circuit transmission line from masking or overshadowing potential low level impedance anomalies by preventing the open circuit reflections from occurring and masking low level impedance anomalies.

The reflectometry operation is used to determine the distance to any impedance anomalies on the line under test. To perform an accurate reflectometry operation, certain characteristics of the line under test must be determined. The line 22 being tested can be characterized in terms of resistance (R), inductance (L), capacitance (C) and conductance (G) per unit length. These parameters are typically available from tabulated industry sources and depend upon the type and characteristics of the wire used for the transmission line. Using these parameters, a frequency dependent propagation constant, $\tau$, can be calculated as:

$$\tau = \alpha + j\beta = ((R+jwL)(G+jwC))^{1/2} \text{ where } w=2\pi f$$

The real part of the propagation constant $\alpha(f)$, is the attenuation along the line per unit of length. Since the envelope of a signal propagating along the line as a function of distance is attenuated by $e^{-\alpha(f)t}$, $\alpha(f)$ can be determined. The effect of the frequency dependent propagation constant is that the amplitude decay of the signal is less pronounced for reflected signals propagating on shorter loops. This fact can be used to compensate for line attenuation and thereby increase the accuracy of the distance calculation.

For an arbitrary waveform, v(t), that is the sum of two waveforms of some frequency, $f_o$, a minimum will occur in v(t) at some delay, $t_o$, of one waveform relative to the other. For a transmission line, this occurs when a waveform, $v_o$, propagating downstream along the line is combined with a waveform, $v_1$, reflected from an anomaly, such as a bridged tap.

In general, the combination of these two waveforms can be expressed as:

$$v(t)=v_o(t)+v_1([t-t_o])$$

$$v(t)=V_o \sin(2\pi f_o t)+V_1 \sin(2\pi f_o[t-t_o])$$

Since the downstream and upstream propagating waveform components have the same frequency, v(t) will have a local minimum due to destructive interference at some time delay, $t_o$, when the arguments of $v_o$ and $v_1$ differ by $\pi$ radians. Namely:

$$(2\pi f_o t)-(2\pi f_o[t-t_o])=\pi$$

Dividing this expression by $2\pi f_o t$ and solving for to, yields: $t_o=1/2f_o=T_o/2$, where the period $T_o$ of the waveform is $1/2f_o$.

Figure 3A:
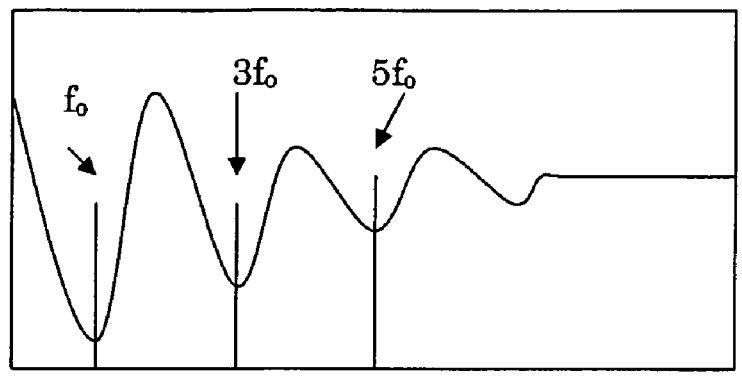
FIG. 3(a) is a frequency domain graph of a line response to a swept frequency signal and FIG. 3(b) is a time domain graph of the line response of FIG. 3(a)

As shown in the signal amplitude vs. frequency diagram of FIG. 3(a), a null occurs at $f_o$; nulls in v(t) also occur for frequencies $f_k$, where $f_k > f_o$, and the arguments of $v_o$ and $v_1$ differ by odd multiples of $\pi$. If k is a positive integer, the nulls will occur when:

$$(2\pi f_k t) - (2\pi f_k [t-t_o]) = 2\pi f_k t_o = (2k+1)\pi$$

Letting the period $T_k = 1/f_k$, then $$2\pi f_k t_o = 2\pi t_o/T_k = 2\pi (T_o/2)/T_k = (2k+1)\pi$$

$$T_o/T_k = (2k+1)$$

Substituting $T_o = 1/f_o$, $T_k = 1/f_k$ $$f_k/f_o = (2k+1),$$

or $$f_k = f_o(2k+1), \text{ for } k = 0, 1, 2, \ldots$$

The periodicity of the nulls can be seen by examining the difference in frequency between two adjacent nulls $f_m$ and $f_{m+1}$.

From the foregoing:

$$f_{m+1} - f_m = f_o(2[m+1]+1) - f_o(2m+1) = 2f_o,$$
$$\text{for } m = 0, 1, 2, \ldots$$

This means that a linear sweep of a transmission line having a single reflection point (e.g., bridged tap) will produce nulls in the frequency response at frequencies $f_o$, $3f_o$, $5f_o$, $7f_o$, etc., as shown in the amplitude vs. frequency response diagram of FIG. 3(a).

Denoting $F_o$ as the repetition rate of the nulls for $t = t_o$ in the frequency domain, then:

$$F_o = 1/(\text{period of the null}) = 1/(f_{m+1} - f_m) = 1/2f_o\pi$$

In general, the null repetition rate in the frequency domain $F_n$ is given by: $F_n = 1/2f_n$, where $f_n$ is the lowest frequency at which a null occurs when the delay $t = t_n$.

From the above relationships, $F_o$ corresponds to $t_o$ and, in general $F_n$ corresponds to $t_n$, and is the same as the round-trip delay of the signal from the line access location to the point of reflection and back. In order to determine the length of time required for the waveform to propagate to an impedance-mismatch reflection point, it may be observed that $t_o$ is representative of the total time required for the downstream propagating waveform to be reflected back to the access location at which the measurement is taken. This one-way delay $t_r = t_o$. To determine the distance to this reflection point from the access location, the propagation velocity $v_p$ of the waveform along the transmission line must be known.

In general, using $\epsilon_r$ as the dielectric constant of the transmission line insulation, c as the velocity of light in free space, and $\mu_r$ as relative permeability, then the propagation velocity along the transmission line may be expressed as:

$$v_p = c(\epsilon_r \mu_r)^{-1/2}.$$

Thus, knowing the type of cable from industry available specifications allows the propagation velocity to be readily determined. A typical value for the propagation velocity is approximately ⅔ the velocity of light.

Once the propagation velocity is determined, the distance D from the access location to the location of the impedance mismatch reflection (e.g., bridge tap) may be determined by the expression:

$$D = t_r v_p = v_p t_o/2 = T_o v_p/4.$$

Thus, D is proportional to $T_o/4$, which is one-quarter wavelength of the sinusoid waveform having a frequency $f_o$.

Substituting $T_o = 1/f_o$, yields $D = v_p/4f_o$. Since the distance D is inversely proportional to frequency, the minimum resolvable distance $D_{min} = v_p/2f_{max}$.

Figure 3B:
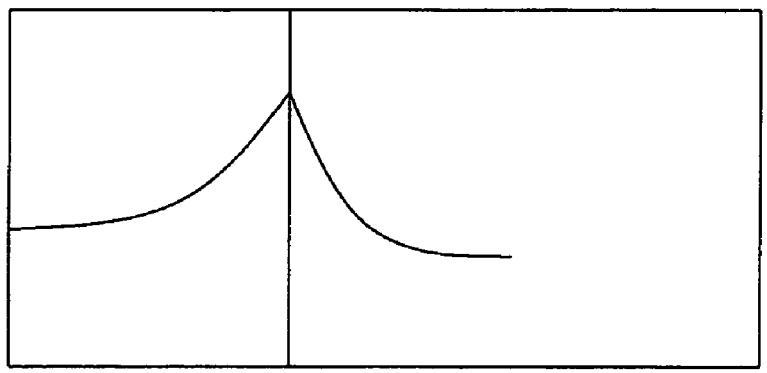

When the response of the transmission line to the frequency swept signal is transformed into the time domain, the distance to the reflecting discontinuity will appear as a peak in the graph as shown in FIG. 3(b).

As pointed out above, the response waveform v(t) seen at the signal measurement point will contain components produced by a plurality of reflection points as:

$$v(t) = v_o(t) + v_t(t-t_o) + v_2(t-t_1) + v_3(t-t_2) + \ldots v_n(t-t_{n-1}).$$

Since these components are associated in general with impedance discontinuities caused by physical characteristics in the line separated by varying distances from the source, the delays $t_o, t_1, \ldots t_{n-1}$, associated with these reflections will be mutually different, so that the values $T_o/2, T_1/2, \ldots T_{n-1}/2$, and thus the frequencies $f_o, f_1, \ldots f_{n-1}$, will be mutually different.

As $f_n$ is unique for each delay, by identifying the various frequencies $f_n$, the two-way delay times $t_n$ of a reflection from a line discontinuity may be readily determined. As pointed out above, once the time delay is known, the distance D to the impedance mismatched discontinuity may be readily determined.

By performing a frequency domain reflectometry operation or a time domain reflectometry operation, the location of any impedance discontinuities or anomalies may be determined. If the reflectometry based results indicate that there is a reflecting discontinuity on the line, a non-linear junction detection method is then performed to determine if the reflecting discontinuity is a semiconductor based discontinuity and, thus, potentially a covert surveillance device. Alternatively, if no known electronic devices are coupled to the line, the non-linear junction detection process can be performed first to determine if a semiconductor based non-linear junction is present and the reflectometry process subsequently performed to determine the location of the semiconductor based non-linear junction. Thus, once all of the reflective anomalies on a line under test have been identified, a non-linear junction type analysis is performed to determine the nature of the reflective anomalies.

A non-linear junction detection process works on the principle that by radiating a non-linear junction with electromagnetic waves of sufficient power, detectable harmonics will be produced and re-radiated by the non-linear junction at frequencies that are integral multiples of the transmitted frequency. Semiconductors such as are found in modern electronics include non-linear junctions. However, many types of non-linear junctions occur outside of electronic devices. For example, normal rust and corrosion on metal surfaces creates non-linear junctions or some types of dissimilar metals touching can produce non-linear junctions. Because these non-linear junctions are not indicative of an electronic device, it is extremely beneficial to be able to distinguish between the harmonics re-radiated by a non-linear junction formed by a metal junctions and those re-radiated by a semiconductor non-linear junction such as found in an electronic surveillance device.

A preferred embodiment of the present invention distinguishes between the two types of non-linear junctions by examining and comparing the amplitudes of the second and third harmonic signals. These harmonic signals have a frequency that is equal to two and three times the frequency of the transmitted signal respectively. Semi-conductor non-linear junctions tend to re-radiate relatively strong second harmonics and relatively weak third harmonics. Conversely, a dissimilar metal non-linear junction will tend to re-radiate much stronger signals at the third harmonic frequency than at the second harmonic frequency. Thus, by detecting and comparing the amplitude of the re-radiated second harmonic signal to the amplitude of the re-radiated third harmonic signal, the present invention can discriminate between the semiconductor based and non-semiconductor based non-linear junctions.

Figure 4A:
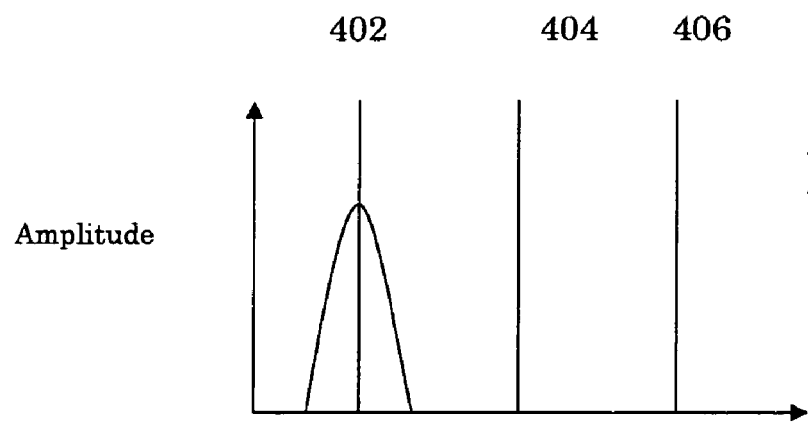
FIGS. 4(a–c) are frequency domain graphs of the line response to a non-linear junction detection signal for a line having no non-linear junctions, a non-semiconductor based non-linear junction and a semiconductor based non-linear junction.
Figure 4B:
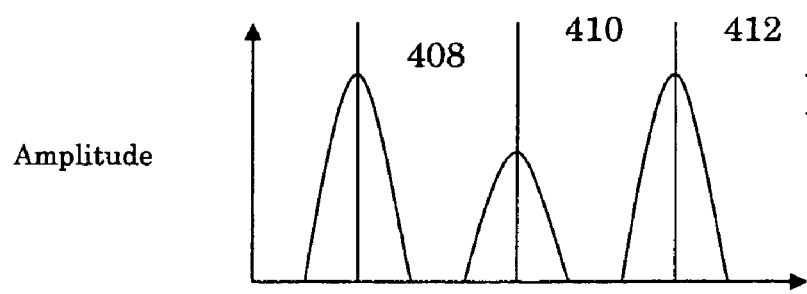
Figure 4C:
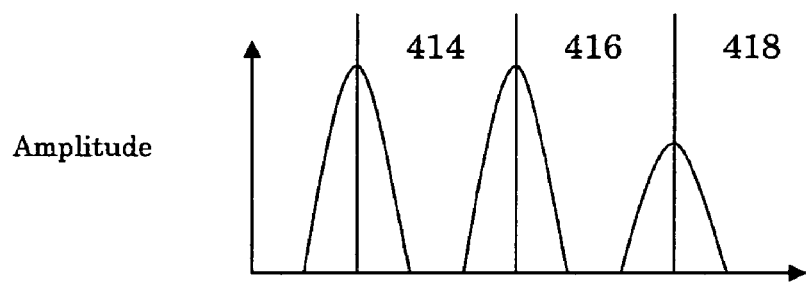

For example, referring now to FIG. 4(a), if a signal 402 is transmitted down a line at first frequency such as 227.5 kHz and no non-linear junctions are coupled to the line, no significant harmonic signals will be observed at the second harmonic frequency 404 of 455 kHz or the third harmonic frequency 406 of 682.5 kHz. Conversely, if a non-semiconductor based non-linear junction is coupled to the transmission line, a signal will be detected at the second harmonic frequency 410 and third harmonic frequency 412 as shown in FIG. 4(b). As discussed in more detail below, since the non-linear junction is not semiconductor based, the second harmonic 410 will tend to be much lower in amplitude than the third harmonic 412. Alternatively, if a semiconductor based non-linear junction is present, the second harmonic 416 will tend to be much greater in amplitude than the third harmonic 418 as shown in FIG. 4(c). Thus, the presence of harmonics of a transmitted signal indicates that non-linear junctions are being encountered by the transmitted signal.

Figure 5A:
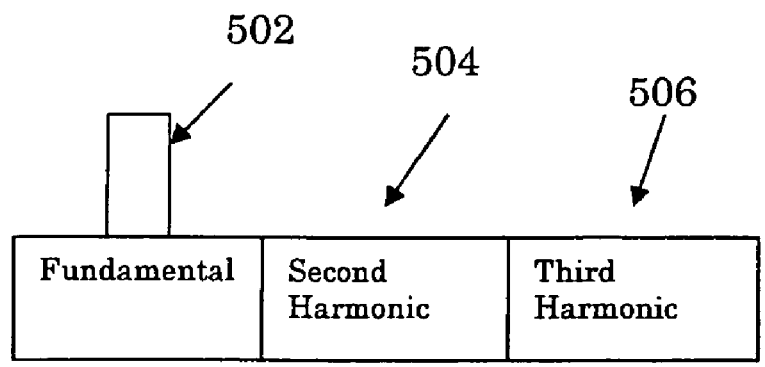
FIGS. 5(a–c) are graphs of representative fundamental and harmonic strength outputs for various types of non-linear junctions.
Figure 5B:
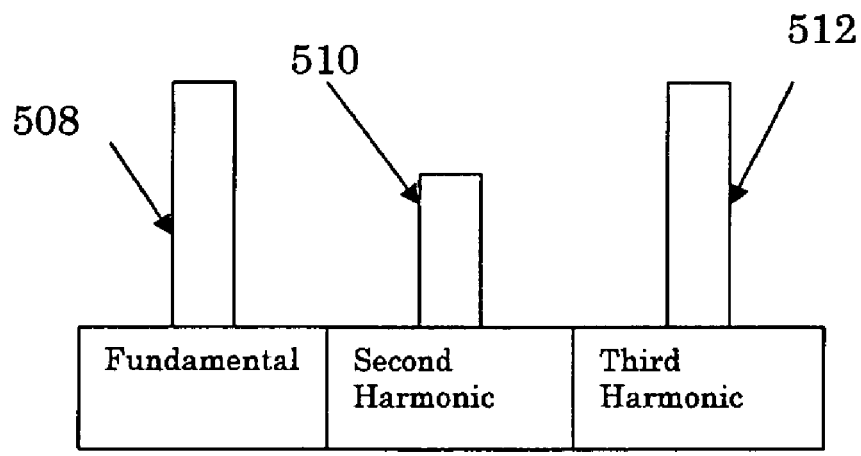
Figure 5C:
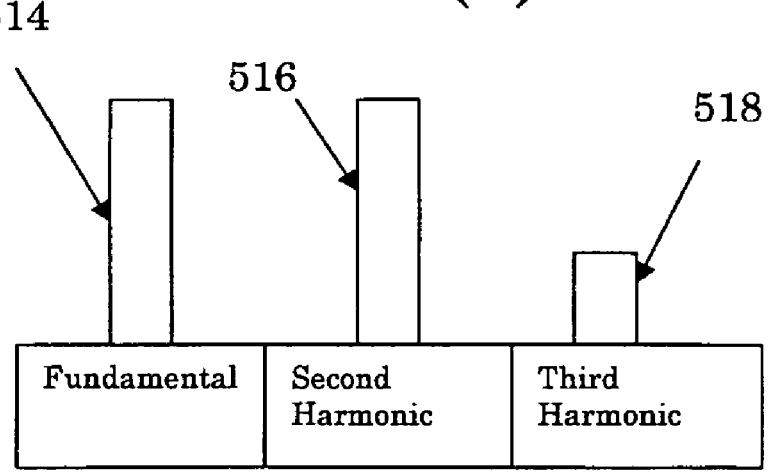

A preferred apparatus for implementing an embodiment of the present invention includes a set of outputs such as shown in FIGS. 5(a–c). In FIG. 5(a), no non-linear junction is present and only the fundamental signal 502 is detected by the receiver. If a corrosive metal non-linear junction is present, the fundamental signal 508, second harmonic 510 and third harmonic 512 will all be present with the amplitude of the third harmonic 512 being larger than the amplitude of the second harmonic 510 as shown in FIG. 5(b). If a semiconductor based non-linear junction is present, the fundamental signal 514, second harmonic 516 and third harmonic 518 will all be present with the amplitude of the second harmonic 516 being much larger than the amplitude of the third harmonic 518 as shown in FIG. 5(c). Thus, the outputs shown in FIG. 5 can be manually reviewed by an operator or electronically monitored to produce an alarm when a semiconductor based non-linear junction is detected.

Figure 6:
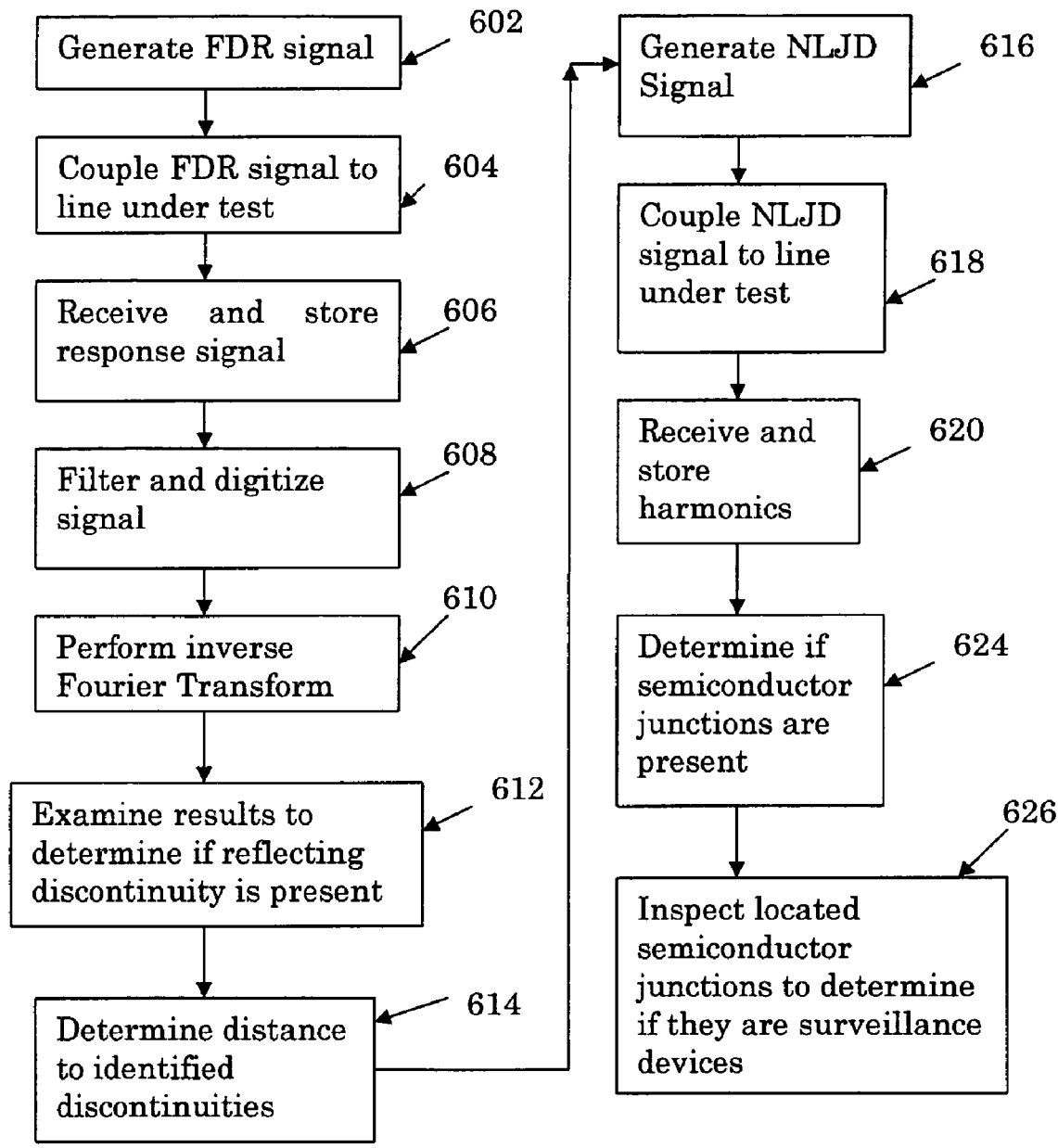
FIG. 6 is a flow chart of a method for detecting and locating a covert surveillance device attached to a conductive wire in accordance with an embodiment of the present invention.

Referring now to FIG. 6, a flow chart of a method for detecting the presence of covert surveillance devices coupled to a transmission line in accordance with an embodiment of the present invention is shown. The method commences in step 602 with the generating of a frequency domain reflectometry signal. As discussed in more detail herein, the signal is preferably a linearly swept frequency sinusoidal signal. However, it will be appreciated by those skilled in the art that a variety of different signals could be used. Next, in step 604, the frequency domain reflectometry signal is coupled to the line which is being tested for surveillance devices. The frequency domain reflectometry signal is preferably coupled to the transmission line while the line is "wet" or actively connected within its circuit. In step 606, the line under test's response to the test signal is received and stored for each of a predetermined number of frequencies. The received response is then filtered in step 608 to remove frequencies substantially above or below the transmitted signal's frequency and digitized such that it can be digitally processed. An inverse Fourier Transform is performed on the digitized data to place the data in the time domain in step 610. Once in the time domain, the results are manually or automatically examined to determine if any reflecting discontinuities are present in step 612 as described in more detail herein. If a reflecting discontinuity is identified, the distance to the identified discontinuity is determined in step 614. While the embodiment of FIG. 6 uses a frequency domain based reflectometry process, a time domain based reflectometry process could also be used as set forth herein.

In step 616, a non-linear junction detection signal is generated and coupled to the line under test in step 618. The non-linear junction detection signal is preferably coupled to a "dry" line that has been disconnected from its normal operating circuit. This insures that any known electronics normally coupled to the line do not radiate harmonics and, thereby, inhibit the detection of any covert surveillance devices. In step 620, any harmonics generated on the line in response to the non-linear junction detection signal are received and stored. The amplitudes of the harmonics are automatically or manually examined in step 624 to determine if any of the detected junctions are indicative of a semiconductor. Finally, in step 626, any identified semiconductor based non-linear junctions are inspected to determine if they are in fact associated with a concealed surveillance device. Although not discussed with respect to FIG. 6, a DC bias voltage could be used in conjunction with the method as set forth in more detail herein above.

The present invention is also useful in inspecting conductive structures in the automobile, airline and construction industries. For example, by applying a test signal to a wiring harness, wire interconnections, semiconductor devices and corrosive junctions present in the wiring harness can be identified and located. Thus, such an inspection will be able to determine if the wiring harness is properly connected, excessively corroded and/or connected to the proper semiconductor based devices. Therefore, although the present invention has been primarily described with respect to counter surveillance applications, those skilled in the art will appreciate that it can be used in a wide variety of applications.

Although there have been described particular embodiments of the present invention of a new and useful method and apparatus for surveillance device detection utilizing non-linear junction detection and time or frequency domain reflectometry, it is not intended that such references be construed as limitations upon the scope of this invention except as set forth in the following claims.

Thus, although there have been described particular embodiments of the present invention of a new and useful SURVEILLANCE DEVICE DETECTION UTILIZING NON-LINEAR JUNCTION DETECTION AND REFLECTOMETRY, it is not intended that such references be construed as limitations upon the scope of this invention except as set forth in the following claims.

What is claimed is:

1. An apparatus for detecting the presence of a corrosive junction or an electronic device coupled to a line under test, said apparatus comprising:

a signal generator for generating a reflectometry test signal and a non-linear junction detection test signal and coupling said test signals to said line under test;

an analog-to-digital converter for receiving response signals from said line under test and converting said response signals into digital data; and digital processing circuitry for selectively controlling said signal generator to generate said reflectometry test signal and said non-linear junction detection test signal and processing said digital data received in response to said generated signals to locate impedance anomalies on said line under test and examining a re-radiated signal at a harmonic frequency of said transmitted non-linear junction detection signal to determine if any semiconductor based non-linear junctions are coupled to said line under test; and an output for communicating results to an operator of said apparatus.

2. The apparatus of claim 1 wherein a single test signal is used as said reflectometry test signal and said nonlinear junction detection test signal.

3. The apparatus of claim 1 where said digital processing circuitry has processing logic for comparing an amplitude of a reradiated second harmonic and an amplitude of a reradiated third harmonic of said non-linear junction detection test signal.

4. The apparatus of claim 1 wherein said digital processing circuitry determines a distance to said located impedance anomalies.

5. The apparatus of claim 1 wherein said digital processing circuitry provides information regarding the reactive nature of said impedance anomaly with regards to capacitance, inductance, or resistance.

6. The apparatus of claim 1 wherein said reflectometry test signal is a frequency domain reflectometry test signal.

7. The apparatus of claim 1 wherein said output comprises a graphic display that identifies impedance anomalies associated with semiconductor or corrosive/dissimilar metal based non-linear junctions.

8. The apparatus of claim 1 further comprising a resistive load coupled to said line under test when said line under test is disconnected from a normal operating circuitry to improve said line's response to said reflectometry test signal.

9. The apparatus of claim 1 wherein a DC voltage is applied to said line under test when said line under test is disconnected from it's normal operating circuitry to enhance or alter the line's response to either the reflectometry or the non-linear junction test signals.

10. The apparatus of claim 9 wherein said DC voltage is changed in value or polarity to evaluate variations in the line under test's response to the reflectometry or non-linear junction detection test signals at different DC voltages.

11. A device for determining whether an electronic device is coupled to a line under test and locating any such electronic device identified, said device comprising:

a signal generator for selectively generating signals and coupling said signals to said line under test;

an analog-to-digital converter for converting response signals received from said line under test into digital data; and a digital processor for selectively controlling said analog-to-digital converter and said signal generator wherein said processor further comprises:

reflectometry processing logic for implementing a reflectometry operation to locate any impedance anomalies on said line under test; and non-linear junction detection processing logic for performing a non-linear junction detection operation to determine if any semi-conductor based non-linear junctions are coupled to said line under test.

12. The device of claim 11 wherein said reflectometry processing logic further comprises processing logic for performing Fourier Transform math operations.

13. The device of claim 11 further comprising a graphic display for displaying results of said reflectometry operation and said non-linear junction device detection operation to a user of said device such that impedance anomalies associated with semiconductor based non-linear junctions are identified by said display.

14. The device of claim 11 wherein said non-linear junction detection operation further comprises determining whether any detected non-linear junctions are semiconductor or non-semiconductor based.

15. The device of claim 11 wherein said non-linear junction detection operation is performed with said line under test disconnected from a normal operating circuit.

16. The device of claim 15 wherein a DC bias voltage is applied to said line under test to enhance said line's response to said reflectometry and said non-linear junction detection operations.

17. The device of claim 16 wherein said DC bias voltage is a time varying DC voltage.

18. The device of claim 15 further comprising a resistive load coupled to said line under test to enhance the reflectometry operation.

19. The device of claim 11 wherein said reflectometry operation is one of a frequency domain reflectometry operation and a time domain reflectometry operation.

* * * * *